United States Patent
Sato

(10) Patent No.: US 8,164,117 B2
(45) Date of Patent: Apr. 24, 2012

(54) NITRIDE SEMICONDUCTOR DEVICE

(75) Inventor: Ken Sato, Saitama (JP)

(73) Assignee: Sanken Electric Co., Ltd., Niiza-Shi, Saitama-Ken (JP)

( * ) Notice: Subject to any disclaimer, the term of this patent is extended or adjusted under 35 U.S.C. 154(b) by 86 days.

(21) Appl. No.: 12/604,706

(22) Filed: Oct. 23, 2009

(65) Prior Publication Data

US 2010/0102357 A1    Apr. 29, 2010

(30) Foreign Application Priority Data

Oct. 27, 2008  (JP) ................................. 2008-275717

(51) Int. Cl.
H01L 29/66 (2006.01)

(52) U.S. Cl. ................. 257/194; 257/190; 257/E29.248

(58) Field of Classification Search .................. 257/192, 257/E29.246, 190, 194, E29.248; 438/285, 438/590
See application file for complete search history.

(56) References Cited

U.S. PATENT DOCUMENTS

| | | | |
|---|---|---|---|
| 6,489,628 B1 | 12/2002 | Morizuka et al. | |
| 7,470,958 B2 * | 12/2008 | Hirose et al. | 257/355 |
| 7,521,707 B2 | 4/2009 | Kawasaki et al. | |
| 2006/0214188 A1 | 9/2006 | Kawasaki et al. | |
| 2007/0284653 A1 * | 12/2007 | Ueno et al. | 257/324 |
| 2008/0087915 A1 * | 4/2008 | Uemoto et al. | 257/192 |
| 2008/0093626 A1 * | 4/2008 | Kuraguchi | 257/190 |

FOREIGN PATENT DOCUMENTS

| | | |
|---|---|---|
| JP | 2001-077353 | 3/2001 |
| JP | 2006-269534 | 10/2006 |
| JP | 2007-165719 | 6/2007 |

* cited by examiner

*Primary Examiner* — David Vu

(74) *Attorney, Agent, or Firm* — Wilmer Cutler Pickering Hale and Dorr LLP

(57) ABSTRACT

A nitride semiconductor device includes: a main semiconductor region comprising a first nitride semiconductor layer having a first band gap, and a second nitride semiconductor layer having a second band gap larger than the first band gap, a heterojunction being formed between the first nitride semiconductor layer and the second nitride semiconductor layer such that a two-dimensional electron gas layer can be caused inside the first nitride semiconductor layer based on the heterojunction; a source electrode; a drain electrode; a third nitride semiconductor layer formed on the first nitride semiconductor layer and between the source electrode and the drain electrode; a fourth nitride semiconductor layer formed on the third nitride semiconductor layer and having p-type conductivity; and a gate electrode formed on the fourth nitride semiconductor layer. The third nitride semiconductor layer has a third band gap smaller than the first band gap.

5 Claims, 2 Drawing Sheets

NITRIDE SEMICONDUCTOR DEVICE

CROSS-REFERENCE TO RELATED APPLICATIONS

This application is based upon and claims priority from Japanese Patent Application No. 2008-275717 filed on Oct. 27, 2008, the entire contents of which are incorporated herein by reference.

BACKGROUND OF THE INVENTION

1. Technical Field

The present invention relates to a high electron mobility transistor (HEMT) of a normally-off type (enhancement type) formed of a nitride semiconductor device.

2. Description of the Related Art

A nitride semiconductor has an electric field drift speed and a breakdown electric field strength very higher than Si or GaAs. At a heterojunction interface occurring between nitride semiconductors, a high-density carrier layer called a two-dimensional carrier gas is formed by a polarization effect. From these features, for example, a high electron mobility transistor (HEMT) having an AlGaN/GaN heterojunction structure is applied as a switching device for power source operating at a large current and a high voltage.

The HEMT using GaN (0001) plane has a negative gate threshold voltage, and has characteristics in which a current flows between a source electrode and a drain electrode in a state in which a gate control voltage is not applied to a gate electrode, that is, characteristics of a normally-on type (depletion type). However, a switching device is desired to be a normally-off type (enhancement type) having a positive gate threshold voltage in order to ensure safety at the time of abnormality.

JP-A-2007-165719 describes a HEMT in which a channel layer made of GaN is formed on a barrier layer made of AlGaN in a GaN/AlGaN heterojunction. According to the HEMT, a lattice constant of the channel layer is larger than a lattice constant of the barrier layer, so that piezo polarization and spontaneous polarization occurring in the channel layer are canceled and thereby a carrier concentration of a two-dimensional electron gas (2DEG) formed in the channel layer can be reduced and the HEMT having characteristics of a normally-off type can be obtained.

SUMMARY OF THE INVENTION

However, in the above-described HEMT, from its structure, a distance between a gate electrode and a drain electrode becomes equal to a film thickness of an insulator layer formed on a surface of the gate electrode, so that the distance is small and hence high resistance to voltage could not be obtained. Also, an increase in gate capacity by an increase in gate length causes a decrease in high-frequency characteristics or a decrease in switching speed of the HEMT. From these, the above-described HEMT may not be suitable for a high-frequency device or a power device.

An object of the present invention is to provide a normally-off type HEMT having enhanced high-frequency characteristics, high switching speed and high resistance to voltage.

According to an aspect of the invention, there is provided a nitride semiconductor device comprising: a main semiconductor region comprising a first nitride semiconductor layer having a first band gap, and a second nitride semiconductor layer having a second band gap larger than the first band gap, a heterojunction being formed between the first nitride semiconductor layer and the second nitride semiconductor layer such that a two-dimensional electron gas layer can be caused inside the first nitride semiconductor layer based on the heterojunction; a source electrode formed on the main semiconductor region; a drain electrode formed on the main semiconductor region and separated from the source electrode; a third nitride semiconductor layer formed on the first nitride semiconductor layer and between the source electrode and the drain electrode; a fourth nitride semiconductor layer formed on the third nitride semiconductor layer and having p-type conductivity; and a gate electrode formed on the fourth nitride semiconductor layer, wherein the third nitride semiconductor layer has a third band gap smaller than the first band gap.

DETAILED DESCRIPTION OF THE EMBODIMENTS

A HEMT according to an embodiment of the invention will be described with reference to the drawings.

Figure 1:
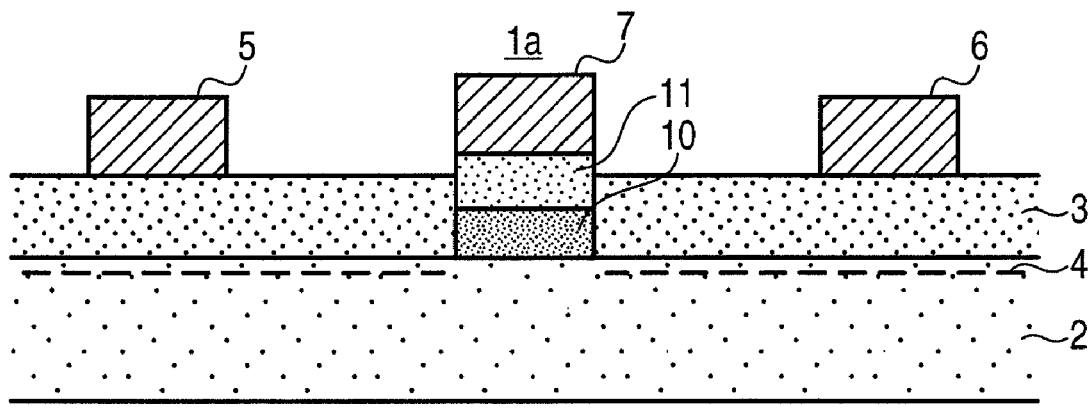
FIG. 1 is a cross-sectional view of a HEMT according to a first embodiment of the invention.

A HEMT 1a according to a first embodiment of the invention shown in FIG. 1 includes a channel layer 2 (an example of a first nitride semiconductor layer) formed on a single-crystal silicon semiconductor substrate (not shown), a barrier layer 3 (an example of a second nitride semiconductor) formed on the channel layer 2, a source electrode 5 formed on the barrier layer 3, a drain electrode 6 formed on the barrier layer 3 and separated from the source electrode 5, a first gate layer 10 (an example of a third nitride semiconductor layer) formed so as to abut on the channel layer 2 and extend through the barrier layer 3 between the drain electrode 6 and the source electrode 5 on the channel layer 2, a second gate layer 11 (an example of a fourth nitride semiconductor layer) formed on the first gate layer 10, and a gate electrode 7 formed on the second gate layer 11. In other words, combination of the channel layer 2 and the barrier layer 3 can be an example of a main semiconductor region.

The channel layer 2 is formed, for example, of $Al_xGa_{1-x}N$ ($0<x\leqq1$) and is formed on a single-crystal semiconductor substrate (not shown) using an epitaxial growth method such as a MOCVD method. In the embodiment, the channel layer is obtained by forming an $Al_{0.3}Ga_{0.7}N$ layer of 0.5 to 2.0 μm. Also, the barrier layer 3 is formed of a nitride semiconductor material having a band gap larger than that of the channel layer 2 and is formed by $Al_yGa_{1-y}N$ ($0<y\leqq1$) $x<y$) in the embodiment. The barrier layer 3 is formed by increasing an Al composition ratio by a technique similar to the channel layer 2. In the embodiment, the barrier layer is obtained by forming an $Al_{0.5}Ga_{0.5}N$ layer of 20 nm. Since a band gap of the channel layer 2 is larger than that of the barrier layer 3, a two-dimensional electron gas layer (2DEG layer) 4 by piezo polarization and spontaneous polarization is formed in the channel layer 2 based on a heterojunction formed by the channel layer 2 and the barrier layer 3. Since an electric field direction based on this piezo polarization is equal to an electric field direction based on the spontaneous polarization of the channel layer 2, a carrier concentration of the 2DEG layer 4 higher than that of a conventional HEMT is obtained.

The first gate layer 10 is formed of a nitride semiconductor material having a band gap smaller than that of the channel layer 2 and is formed by GaN in the embodiment. The first gate layer 10 is obtained by: forming a mask so as to have an opening in a position in which the first gate layer 10 is formed in the barrier layer 3; performing dry etching such as RIE so as to form an opening part reaching the channel layer 2; and thereafter forming a non-doped GaN layer of 10 to 50 nm by the epitaxial growth method such as the MOCVD method. As used herein, the term "non-doped" means that semiconductor impurities are not added intentionally. The first gate layer 10 grows so as to be lattice-matched to AlGaN of the channel layer 2 and has a band gap smaller than that of the channel layer 2, so that piezo polarization by compressive stress affects the first gate layer 10 based on a heterojunction formed by the channel layer 2 and the first gate layer 10. That is, from a local point of view, it can be rephrased that the channel layer 2 acts as the barrier layer and the first gate layer 10 acts as the channel layer. Since an electric field direction based on this piezo polarization becomes a direction opposite to an electric field direction based on spontaneous polarization of the first gate layer 10, the 2DEG layer becomes resistant to being formed in the vicinity of a junction interface between the first gate layer 10 and the channel layer 2 in the first gate layer 10.

In addition to the manufacturing method described above, the barrier layer 3 may be selectively grown on the channel layer 2 after a non-doped GaN layer is grown on the whole surface of the channel layer 2 and dry etching is performed except for a position in which the first gate layer 10 is formed. Also, the first gate layer 10 may be formed by AlGaN with an Al composition ratio smaller than that of the channel layer 2.

The second gate layer 11 includes GaN doped with p-type impurities such as magnesium (Mg), and is formed by performing epitaxial growth continuously using the MOCVD method following a process of forming the first gate layer 10. The second gate layer is formed so that a thickness of the second gate layer 11 in the embodiment is 100 nm and its carrier (hole) concentration becomes $1 \times 10^{18}$ to $1 \times 10^{19}$ cm$^{-3}$.

The source electrode 5, the drain electrode 6 and the gate electrode 7 are formed of a laminated structure including, for example, aluminum (Al) and gold (Au), and are formed by patterning by a photolithography step after evaporated on the barrier layer 3 and the second gate layer 11. The source electrode 5 and the drain electrode 6 are formed on the barrier layer 3, and a thickness of the barrier layer 3 is very thin and a resistance of a thickness direction is extremely low. Therefore, it is said that the source electrode 5 and the drain electrode 6 are electrically connected to the 2DEG layer 4 through the barrier layer 3. Also, the gate electrode 7 is formed so as to be electrically connected to the second gate layer 11. Although an illustration is omitted, the gate electrode 7 may be formed by a field plate structure extending on the barrier layer 3 through an oxide film disposed on the barrier layer 3.

Next, an operation of the HEMT 1a according to the embodiment will be described.

The first gate layer 10 grows so as to be lattice-matched to AlGaN of the channel layer 2, and a band gap is smaller than that of the channel layer 2. Therefore, it is difficult to occur 2DEG based on a heterojunction between the channel layer 2 and the first gate layer 10. Further, the second gate layer 11 has p-type conductivity, so that a pn junction is formed between the first gate layer 10 and the second gate layer 11 and thereby, the first gate layer 10 is completely depleted by a depletion layer extending from a pn junction interface and normally-off characteristics can be increased.

As a result of that, a current path is divided in the first gate layer 10 in a state in which a positive gate control voltage is not applied to the gate electrode 7. Therefore, a current does not flow in the HEMT 1a even when a potential of the drain electrode 6 is made higher than a potential of the source electrode 5.

On the other hand, when the positive gate control voltage is applied to the gate electrode 7, a pn junction formed by the first gate layer 10 and the second gate layer 11 is forward biased, so that a carrier is generated in the first gate layer 10 and a channel resulting in a current path is formed. When a potential of the drain electrode 6 is made higher than a potential of the source electrode 5 in this state, a drain current flows between the drain electrode 6 and the source electrode 5 via the channel in the first gate layer 10 and the 2DEG layer 4. That is, a nitride semiconductor device having normally-off characteristics is obtained.

Further, according to the HEMT 1a according to the embodiment, high resistance to voltage can be achieved easily by separating the gate electrode 7 from the drain electrode 6. In other words, the distance between the gate electrode and the drain electrode 6 can be increased, for example, as compared with the HEMT described in the background art. Further, a gate length does not increase, so that a high switching speed is obtained. Also, an electric field direction based on spontaneous polarization of the channel layer 2 is equal to an electric field direction based on piezo polarization based on a heterojunction between the channel layer 2 and the barrier layer 3, so that a carrier concentration of the 2DEG layer 4 can easily be made higher than that of a HEMT described in the background art, and an ON resistance of the HEMT 1a can be reduced. Therefore, a high-frequency device having developed high-frequency characteristics or a power device with a high switching speed capable of operating at a large current and high resistance to voltage is obtained.

Figure 2:
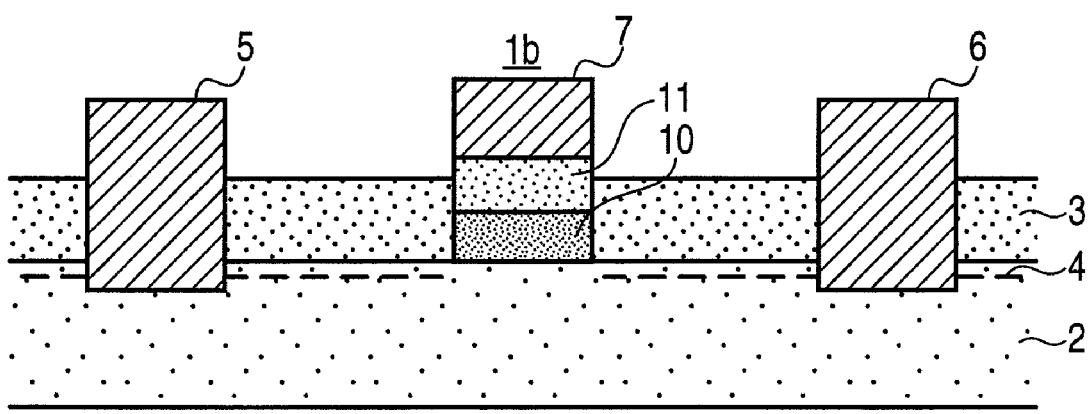
FIG. 2 is a cross-sectional view of a HEMT according to a modified example of the first embodiment of the invention.

Here, in the HEMT 1a according to the first embodiment of the invention, a source electrode 5 and a drain electrode 6 may be formed so as to abut on a 2DEG layer 4 as shown in FIG. 2.

Opening parts in which the source electrode 5 and the drain electrode 6 are formed can be formed simultaneously or separately with an opening part in which a first gate layer 10 is formed in the HEMT 1a, and after a second gate layer 11 is formed, the electrodes can be formed by patterning by a photolithography process after evaporated on a barrier layer 3 and the second gate layer 11.

According to a HEMT 1b formed thus, an effect similar to the HEMT 1a according to the first embodiment of the invention is obtained. Also, an electrical resistance value between the source electrode 5 and the drain electrode 6 and a 2DEG layer 4 can be decreased extremely and an ON resistance of the HEMT 1b can be reduced.

Figure 3:
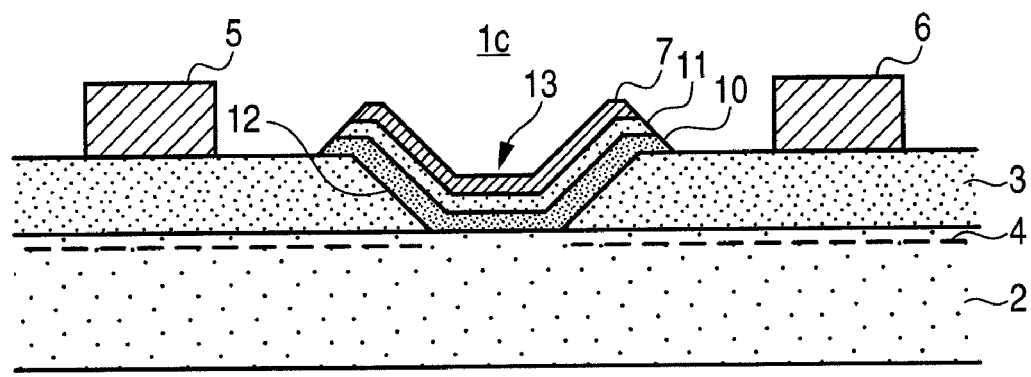
FIG. 3 is a cross-sectional view of a HEMT according to a modified example of the first embodiment of the invention.

Also, as shown in FIG. 3, a recess 13 having a side surface 12 may be formed in a barrier layer 3. Further, a first gate layer 10, a second gate layer 11 and a gate electrode 7 may be formed in a state of extending on the barrier layer 3 including the side surface 12 and a channel layer 2. The recess 13 having the side surface 12 can be formed by forming a mask so as to have a predetermined opening in the barrier layer 3 and performing dry etching such as RIE. In addition, the side surface 12 may be formed so that a thickness of the barrier layer 3 changes gradually or changes stepwise.

The first gate layer 10 and the second gate layer 11 are formed continuously by an epitaxial growth method such as an MOCVD method after the recess 13 is formed on a main semiconductor region.

According to a HEMT 1c according to this example, an effect similar to the HEMT 1a according to the first embodiment can be obtained. Also, the first gate layer 10, the second gate layer 11 and the gate electrode 7 are formed so as to extend on the barrier layer 3 and the channel layer 2, so that a reduction in convergence of an electric field by a field plate effect can well be achieved and higher resistance to voltage can be achieved.

Figure 4:
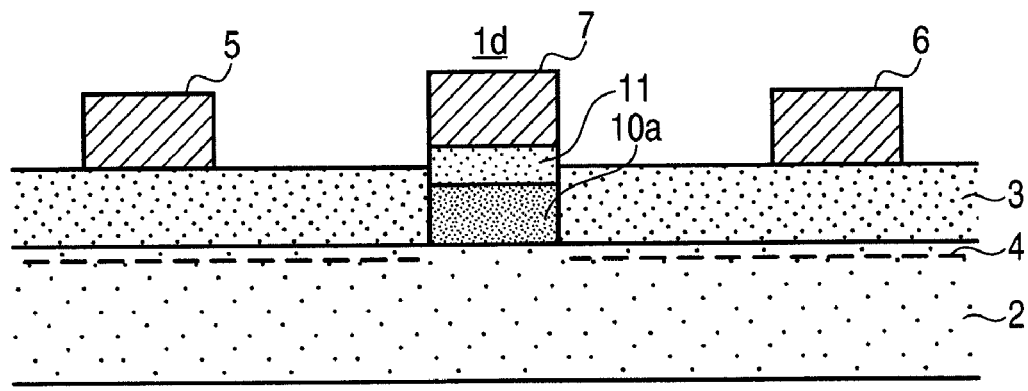
FIG. 4 is a structure sectional view of a HEMT according to a second embodiment of the invention.

Next, a HEMT 1d according to a second embodiment of the invention shown in FIG. 4 will be described. In FIG. 4, the description is omitted by assigning the same numerals to substantially the same elements as FIG. 1.

The HEMT 1d according to the present embodiment differs from the first embodiment in that a first gate layer 10a has an n-type conductivity type, and others are formed similarly.

The first gate layer 10a includes GaN doped with n-type impurities such as silicon (Si), and is formed by adding dichlorosilane ($SiH_2Cl_2$) etc. to a raw material gas and performing an MOCVD method in the process of forming the first gate layer 10 in the first embodiment of the invention. The first gate layer 10a is formed so that a thickness of the first gate layer 10a in the embodiment is 50 nm and its carrier (electron) concentration becomes $1\times10^{17}$ to $1\times10^{19}$ $cm^{-3}$. Also, a thickness of a second gate layer 11 is 50 nm and its carrier (hole) concentration is formed in $1\times10^{17}$ to $1\times10^{19}$ $cm^{-3}$.

According to the HEMT 1d according to this embodiment, an effect similar to the HEMT 1a according to the first embodiment of the invention is obtained. Also, the first gate layer 10a has n-type conductivity, so that an ON resistance can be reduced by forming a channel having a high carrier concentration when a positive gate control voltage is applied.

One example of the embodiments of the invention has been described above, but the invention is not limited to such specific embodiments, and various modifications and changes can be made within the scope of the invention in the claims. Also, each of the embodiments or each of the modified examples may be combined. For example, the second gate layer 11 may be formed by AlGaN having substantially the same Al composition ratio as that of the first gate layer 10 or 10a, and may also be formed by a different material. Also, each of the nitride semiconductor layers may be formed by a material represented by $Al_xIn_yGa_{1-x-y}N$ ($0 \leq x < 1$, $0 \leq y \leq 1$, $0 \leq x+y \leq 1$) including indium (In), and an Al or In composition ratio and/or a thickness of each of the semiconductor layers may be changed. Also, a passivation layer including SiO may be formed on the barrier layer 3.

According to the embodiments of the invention, a normally-off type HEMT having enhanced high-frequency characteristics, high switching speed and high resistance to voltage can be obtained.

What is claimed is:

1. A nitride semiconductor device comprising:
   a main semiconductor region comprising a first nitride semiconductor layer having a first band gap, and a second nitride semiconductor layer having a second band gap larger than the first band gap, a heterojunction being formed between the first nitride semiconductor layer and the second nitride semiconductor layer such that a two-dimensional electron gas layer can be caused inside the first nitride semiconductor layer based on the heterojunction;
   a source electrode formed on the main semiconductor region;
   a drain electrode formed on the main semiconductor region and separated from the source electrode;
   a third nitride semiconductor layer formed on the first nitride semiconductor layer and between the source electrode and the drain electrode;
   a fourth nitride semiconductor layer formed on the third nitride semiconductor layer and having p-type conductivity; and
   a gate electrode formed on the fourth nitride semiconductor layer,
   wherein the third nitride semiconductor layer has a third band gap smaller than the first band gap.

2. The nitride semiconductor device according to claim 1, wherein the third nitride semiconductor layer is a non-doped semiconductor layer.

3. The nitride semiconductor device according to claim 1, wherein the third nitride semiconductor layer has n-type conductivity.

4. The nitride semiconductor device according to claim 1, wherein the third nitride semiconductor layer is formed of $Al_xIn_yGa_{1-x-y}N$ ($0 \leq x < 1$, $0 \leq y \leq 1$, $0 \leq x+y \leq 1$).

5. The nitride semiconductor device according to claim 1, wherein at least a portion of the third nitride semiconductor layer is provided between portions of the second nitride semiconductor layer.

* * * * *